US007821130B2

(12) United States Patent
Hohlfeld et al.

(10) Patent No.: US 7,821,130 B2
(45) Date of Patent: Oct. 26, 2010

(54) MODULE INCLUDING A ROUGH SOLDER JOINT

(75) Inventors: Olaf Hohlfeld, Warstein (DE); Reinhold Bayerer, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/059,188

(22) Filed: Mar. 31, 2008

(65) Prior Publication Data

US 2009/0243089 A1  Oct. 1, 2009

(51) Int. Cl.
*H01L 23/52* (2006.01)
*H01L 21/44* (2006.01)

(52) U.S. Cl. ............... 257/734; 257/E21.476; 257/E23.141; 257/751; 438/612

(58) Field of Classification Search ......... 257/734, 257/700–707, 710, 751, 787, E21.476, E21.511, 257/E23.141, E23.009, E23.051; 438/612, 438/125, 597
See application file for complete search history.

(56) References Cited

U.S. PATENT DOCUMENTS 5,701,034 A * 12/1997 Marrs .................. 257/706

| | | | |
|---|---|---|---|
| 6,844,621 B2 | 1/2005 | Morozumi et al. | |
| 2003/0132271 A1* | 7/2003 | Kao et al. | 228/180.22 |
| 2008/0230905 A1* | 9/2008 | Guth et al. | 257/751 |
| 2009/0134501 A1* | 5/2009 | Ganitzer et al. | 257/666 |

FOREIGN PATENT DOCUMENTS

DE   10 2004 054 063   6/2006

OTHER PUBLICATIONS

"Further Improvements in the Reliability of IGBT Modules", Thomas Schutze, et al., eupec GmbH & Co., (4 pgs.), Jan. 1998.
"Improving the Thermal Reliability of Large Area Solder Joints in IGBT Power Modules", Dr. Karsten Guth, Infineon Technologies AG, (5 pgs.), 2006.
"Joint Industry Standard", IPC/JEDEC J-STED-020C, Jul. 2004 (20 pgs.).

* cited by examiner

*Primary Examiner*—Victor A Mandala
*Assistant Examiner*—Whitney Moore
(74) *Attorney, Agent, or Firm*—Dicke, Billig & Czaja, PLLC

(57) ABSTRACT

A module includes a metallized substrate including a metal layer, a base plate, and a joint joining the metal layer to the base plate. The joint includes solder contacting the base plate and an inter-metallic zone contacting the metal layer and the solder. The inter-metallic zone has spikes up to 100 μm and a roughness ($R_z$) of at least 20 μm.

19 Claims, 4 Drawing Sheets

MODULE INCLUDING A ROUGH SOLDER JOINT

BACKGROUND

Power electronic modules are semiconductor packages that are used in power electronic circuits. Power electronic modules are typically used in vehicular and industrial applications, such as in inverters and rectifiers. The semiconductor components included within the power electronic modules are typically insulated gate bipolar transistor (IGBT) semiconductor chips or metal-oxide-semiconductor field effect transistor (MOSFET) semiconductor chips. The IGBT and MOSFET semiconductor chips have varying voltage and current ratings. Some power electronic modules also include additional semiconductor diodes (i.e., free-wheeling diodes) in the semiconductor package for overvoltage protection.

In general, two different power electronic module designs are used. One design is for higher power applications and the other design is for lower power applications. For higher power applications, a power electronic module typically includes several semiconductor chips integrated on a single substrate. The substrate typically includes an insulating ceramic substrate, such as $Al_2O_3$, AlN, $Si_3N_4$, or other suitable material, to insulate the power electronic module. At least the top side of the ceramic substrate is metallized with either pure or plated Cu, Al, or other suitable material to provide electrical and mechanical contacts for the semiconductor chips. The metal layer is typically bonded to the ceramic substrate using a direct copper bonding (DCB) process, a direct aluminum bonding (DAB) process, or an active metal brazing (AMB) process.

Typically, soft soldering with Sn—Pb, Sn—Ag, Sn—Ag—Cu, or another suitable solder alloy is used for joining a semiconductor chip to a metallized ceramic substrate. Typically, several substrates are combined onto a metal base plate. In this case, the backside of the ceramic substrate is also metallized with either pure or plated Cu, Al, or other suitable material for joining the substrates to the metal base plate. To join the substrates to the metal base plate, soft soldering with Sn—Pb, Sn—Ag, Sn—Ag—Cu, or another suitable solder alloy is typically used.

For vehicular applications, such as hybrid electric vehicles, the coolant of the combustion engine may be used for cooling the power semiconductor modules. Junction temperatures up to 200° C. may be exhibited within the power semiconductor chips. The solder layer between the substrate and the metal base plate experience the temperature of the coolant plus approximately 10° C., which results from the thermal impedance from the substrate to the metal base plate and coolant. The temperature at the substrate is typically around 110° C., but may reach a maximum temperature of up to around 140° C. Therefore, compared to a typical industrial application, the solder layer may experience a wider range of temperature and a temperature swing of approximately 30° C. to 60° C. more than for the industrial application. The additional 30° C. to 60° C. in temperature swing roughly doubles the temperature swing compared to a typical industrial application.

Due to the wide temperature swing during thermal cycling, the lifetime of the power electronic module may be reduced. Cracks may form inside the solder layer after repeated thermal cycles. The cracks can easily spread over the entire solder layer and lead to the failure of the power electronic module. With the increasing desire to use power electronics in harsh environments (e.g., automotive applications) and the ongoing integration of semiconductor chips, the temperature swing experienced by the power electronic modules will continue to increase. Therefore, there is a growing demand for power electronic modules capable of withstanding thermal cycling having a temperature swing greater than or equal to approximately 100° C.

For these and other reasons, there is a need for the present invention.

SUMMARY

One embodiment provides a module. The module includes a metallized substrate including a metal layer, a base plate, and a joint joining the metal layer to the base plate. The joint includes solder contacting the base plate and an inter-metallic zone contacting the metal layer and the solder. The inter-metallic zone has spikes up to 100 µm and a roughness ($R_z$) of at least 20 µm.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
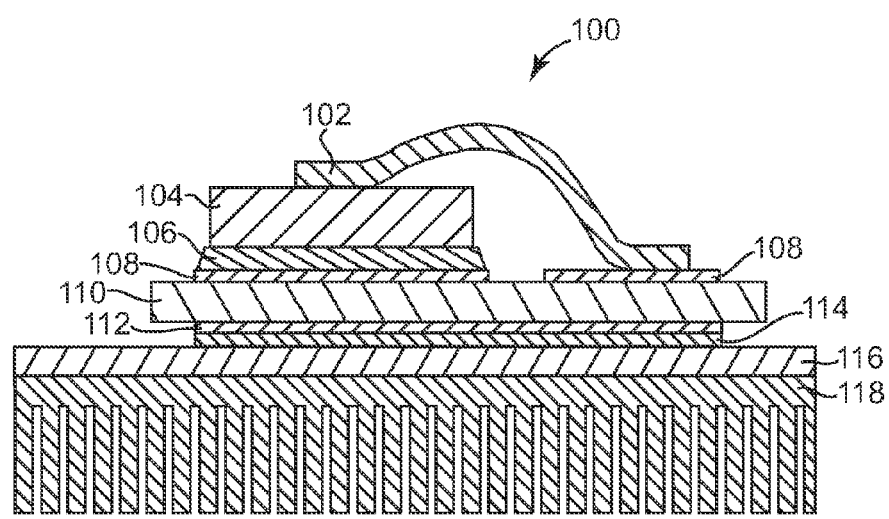
FIG. 1 illustrates a cross-sectional view of one embodiment of a module.

FIG. 1 illustrates a cross-sectional view of one embodiment of a module 100. In one embodiment, module 100 is a power electronic module. Power electronic module 100 includes a bond wire 102, a semiconductor chip 104, a solder joint 106, a metalized ceramic substrate 110 including metal surfaces or layers 108 and 112, a solder joint 114, a metal base plate 116, and a heat sink 118. In one embodiment, solder joint 106 is replaced by a sintered joint formed using a low temperature silver sintering process (e.g., LTJT, NTV). In another embodiment, a transient liquid phase soldering process, which results in an alloy with a melting point greater than 400° C., is used to form joint 106. Solder joint 114 joins metal layer 112 to metal base plate 116. In one embodiment, solder joint 114 includes soft solder and an inter-metallic zone having spikes greater than 10 µm, such as up to 100 µm, and a roughness ($R_z$) of at least 20 µm, where $R_z$ is defined by DIN EN ISO 4287.

In another embodiment, metal layer 112 includes roughness enhancing features, such as trenches, dimples, or other suitable features to increase the roughness of solder joint 114. In one embodiment, the roughness enhancing features are combined with an inter-metallic zone having spikes greater than 10 µm, such as up to 100 µm, to provide a roughness ($R_z$) of at least 20 µm. The roughness of solder joint 114 reduces the stress on the solder joint due to thermal cycling, thereby extending the life of power electronic module 100 by preventing a failure of the solder joint.

As used herein, the term "electrically coupled" is not meant to mean that the elements must be directly coupled together and intervening elements may be provided between the "electrically coupled" elements.

Semiconductor chip 104 includes one or more insulated gate bipolar transistors (IGBTs), metal-oxide-semiconductor field effect transistors (MOSFETs), diodes, or other suitable power semiconductors. A contact on top of semiconductor chip 104 is electrically coupled to a first portion of metal layer 108 through bond wire 102. Bond wire 102 includes Al, Cu, Al—Mg, Au, or another suitable material. In one embodiment, bond wire 102 is bonded to semiconductor chip 104 and the first portion of metal layer 108 using ultrasonic wire bonding. Semiconductor chip 104 is bonded to a second portion of metal layer 108 by solder joint 106.

Metal layer 108 is bonded to the top of ceramic substrate 110. Metal layer 112 is bonded to the bottom of ceramic substrate 110. Metal layers 108 and 112 are bonded to ceramic substrate 110 using a direct copper bonding (DCB) process, a direct aluminum bonding (DAB) process, an active metal brazing (AMB) process, or another suitable process. Ceramic substrate 110 includes $Al_2O_3$, AlN, $Si_3N_4$, or other suitable material. Metal layers 108 and 112 include one or more layers of Cu, Al, Ni, Ag, Au, Pd, or other suitable material. In one embodiment, Cu or Al are bonded to ceramic substrate 110 and Ni, Ag, Au, Pd, or Cu are plated on top of the bonded metals to provide solderable surfaces. Metal layer 112 is joined to base plate 116 by solder joint 114 as previously described above. Base plate 116 includes one or more of Cu, Al, Ni, Ag, Au, Pd, or other suitable metal. In one embodiment, base plate 116 includes Al plated with Ni, Ag, Pd, Au, or Cu. Base plate 116 is coupled to heat sink 118. Heat sink 118 includes Al or another suitable material.

Figure 2:
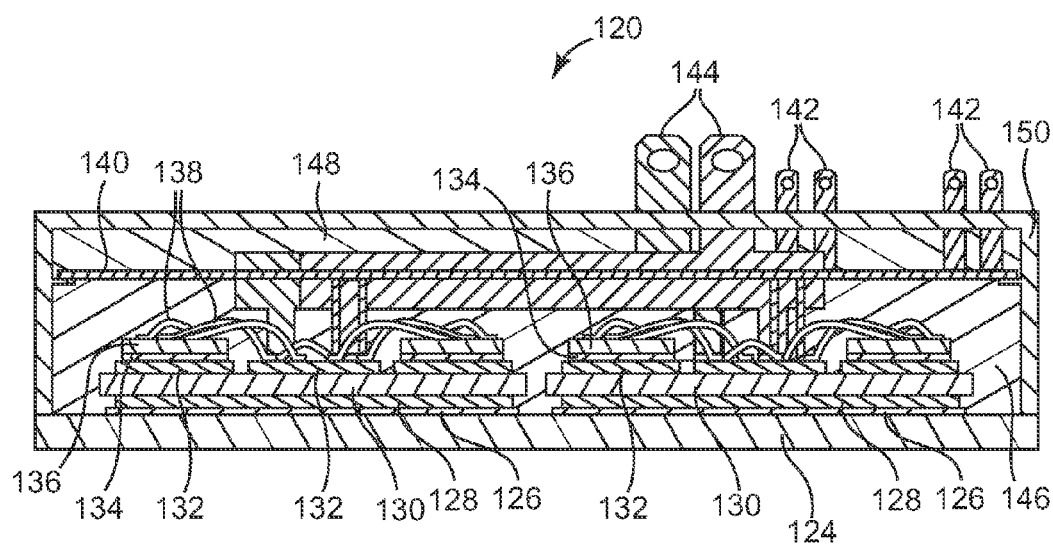
FIG. 2 illustrates a cross-sectional view of another embodiment of a module.

FIG. 2 illustrates a cross-sectional view of another embodiment of a module 120. In one embodiment, module 120 is a power electronic module. Power electronic module 120 includes a metal base plate 124, solder joints 126, metalized ceramic substrates 130 including metal surfaces or layers 128 and 132, solder joints 134, semiconductor chips 136, bond wires 138, a circuit board 140, control contacts 142, power contacts 144, potting 146 and 148, and a housing 150.

Metal layers 128 and 132 are bonded to ceramic substrates 130 using a DCB process, a DAB process, an AMB process, or another suitable process. Ceramic substrates 130 include $Al_2O_3$, AlN, $Si_3N_4$, or other suitable material. Metal layers 128 and 132 include one or more layers of Cu, Al, Ni, Ag, Au, Pd, or other suitable material. In one embodiment, Cu or Al are bonded to ceramic substrates 130 and Ni, Ag, Au, Pd, or Cu are plated on top of the bonded metals to provide solderable surfaces. Solder joints 126 join metal layers 128 to metal base plate 124. In one embodiment, solder joints 126 include soft solder and an inter-metallic zone having spikes greater than 10 µm, such as up to 100 µm, and a roughness ($R_z$) of at least 20 µm.

In another embodiment, metal layers 128 include roughness enhancing features, such as trenches, dimples, or other suitable features to increase the roughness of solder joints 126. In one embodiment, the roughness enhancing features are combined with inter-metallic zones having spikes greater than 10 µm, such as up to 100 µm, to provide a roughness ($R_z$) of at least 20 µm. The roughness of solder joints 126 reduces the stress on the solder joints due to thermal cycling, thereby extending the life of power electronic module 120 by preventing a failure of the solder joints.

Semiconductor chips 136 each include one or more IGBTs, MOSFETs, diodes, or other suitable power semiconductors. Semiconductor chips 136 are bonded to metal layers 132 by solder joints 134. In one embodiment, solder joints 134 are replaced by sintered joints formed using a low temperature silver sintering process (e.g., LTJT, NTV). In another embodiment, a transient liquid phase soldering process, which results in an alloy with a melting point greater than 400° C., is used to form joints 134. Contacts on top of semiconductor chips 136 are electrically coupled to metal layers 132 through bond wires 138. Bond wires 138 include Al, Cu, Al—Mg, Au, or another suitable material. In one embodiment, bond wires 138 are bonded to semiconductor chips 136 and metal layers 132 using ultrasonic wire bonding. Metal layers 132 are electrically coupled to circuit board 140 and power contacts 144. Circuit board 140 is electrically coupled to control contacts 142.

Housing 150 encloses solder joints 126, metallized ceramic substrates 130 including metal layers 128 and 132, solder joints 134, semiconductor chips 136, bond wires 138, circuit board 140, portions of control contacts 142, and portions of power contacts 144. Housing 150 includes technical plastics or another suitable material. Housing 150 is joined to metal base plate 124.

Potting material 146 fills areas below circuit board 140 within housing 150 around solder joints 126, metallized ceramic substrates 130 including metal layers 128 and 132, solder joints 134, semiconductor chips 136, and bond wires 138. In one embodiment, potting material 146 includes a soft potting material, such as silicone gel or another suitable material. Potting material 148 fills the area above circuit board 150 within housing 150 around portions of control contacts 142 and portions of power contacts 144. In one embodiment, potting material 148 includes a hard potting material, such as epoxy or another suitable material. Potting material 146 and 148 prevents damage to power electronic module 120 by dielectrical breakdown.

Figure 3:
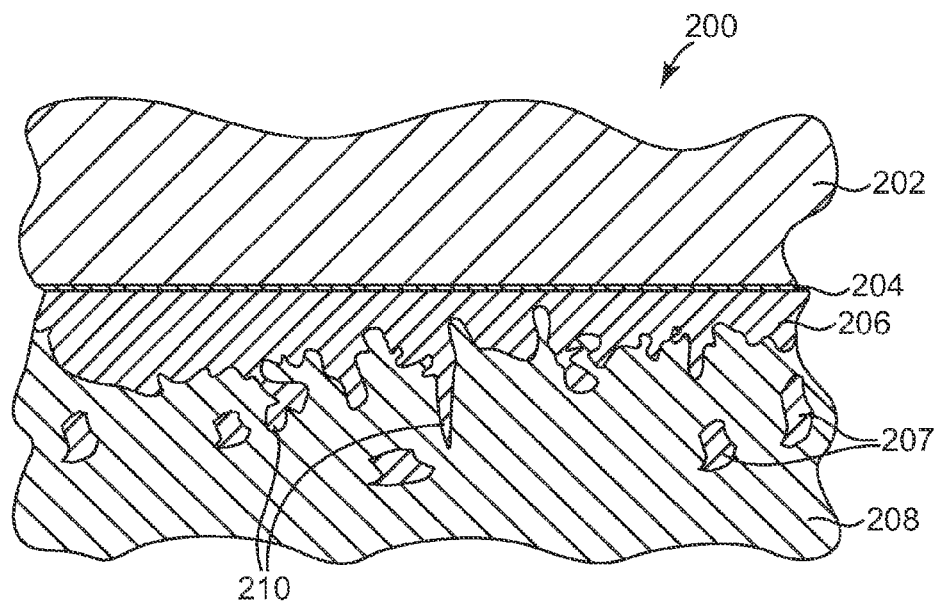
FIG. 3 illustrates a cross-sectional view of one embodiment of a solder joint.

FIG. 3 illustrates a cross-sectional view of one embodiment of a solder joint 200. In one embodiment, solder joint 200 provides solder joint 114 previously described and illustrated with reference to FIG. 1 and solder joints 126 previously described and illustrated with reference to FIG. 2. In another embodiment, solder joint 200 provides solder joint 106 previously described and illustrated with reference to FIG. 1 or solder joints 134 previously described and illustrated with reference to FIG. 2.

Solder joint 200 joins a metal layer 202 of a metallized substrate to a metal base plate (not shown). In one embodiment, metal layer 202 includes an optional surface metal 204 that is different from the metal used for metal layer 202. In one embodiment, metal layer 202 includes Cu, Ni, Ag, or another suitable metal. Optional surface metal 204 includes a plated layer of Ni, NiAu, Ag, NiPd, Cu, or another suitable solderable metal or alloy.

Metal layer 202 or optional surface metal 204 contacts an inter-metallic zone 206, which includes an inter-metallic alloy. Inter-metallic zone 206 contacts soft solder 208, which contacts a base plate (not shown). In addition, islands of inter-metallic alloy 207 are embedded within soft solder 208. In one embodiment, the inter-metallic alloy includes Sn—Cu, such as $Cu_3Sn$ or $Cu_6Sn_5$. In other embodiments, the inter-metallic alloy includes $Sn_aCu_bX_c$ or other suitable inter-metallic alloy that is formed during the soldering process, where X is a third metal, such as Ni, Ag, or another suitable metal that accelerates the formation of the alloy.

In one embodiment, surface metal 204 includes a solderable metal that supports the formation of a thick and rough inter-metallic zone 206 during soldering. In one embodiment, surface metal 204 includes Cu, Ni, Ag, or another suitable material to support the formation of $Sn_aCu_b$ inter-metallic alloys. In another embodiment, surface metal 204 includes solderable metal that includes activators, accelerators, and/or catalysts that support the formation of a thick and rough inter-metallic zone 206 during soldering.

In another embodiment, a thick and rough inter-metallic zone 206 is achieved by using a special soldering process defined by an increased maximum temperature and/or time. In one embodiment, the solder includes more than 50% of Sn, such as more than 80% of Sn, in a Sn—Cu, Sn—Ag, Sn—Ag—Cu, Sn—Sb, Sn—Ag—Sb, or other suitable solder. After the special soldering process, inter-metallic zone 206 includes spikes 210 of inter-metallic alloy reaching a range between approximately 10 μm to 100 μm into soft solder 208. The maximum soldering temperature is greater than 80° C. above the solidus of the solder, such as greater than 110° C., 130° C., or 160° C. In one embodiment, the soldering temperature is approximately 350° C. for at least 20 seconds, such as 180 seconds. In another embodiment, the soldering temperature is at least 330° C. for at least 50 seconds.

In another embodiment, surface metal 204 includes a solderable material that is suitable for forming inter-metallic zones during the soldering process. The base plate, which is joined at the bottom interface of soft solder 208, includes activators, accelerators, and/or catalysts that support the formation of a thick and rough inter-metallic zone 206 at the upper surface of the solder (i.e., at surface metal 204) during soldering. During the soldering process, once the solder liquefies, the activators, accelerators, and/or catalysts diffuse through the solder. In one embodiment, the activators include Cu, Ni, Ag, or another suitable material.

In another embodiment, at least one surface, either the base plate or surface metal 204 includes a base Cu or Cu alloy that supports the acceleration of the formation of inter-metallic zone 206 on surface metal 204. In another embodiment, the solder includes Cu particles, Ni particles, Ag particles, or other suitable activating metals that support the formation of ternary or higher alloys thus accelerating the formation of inter-metallic zone 206. In another embodiment, solder layers within a range of approximately 50 μm to 150 μm are used such that inter-metallic zone 206, including spikes 210, extends throughout soft solder 208.

Figure 4:
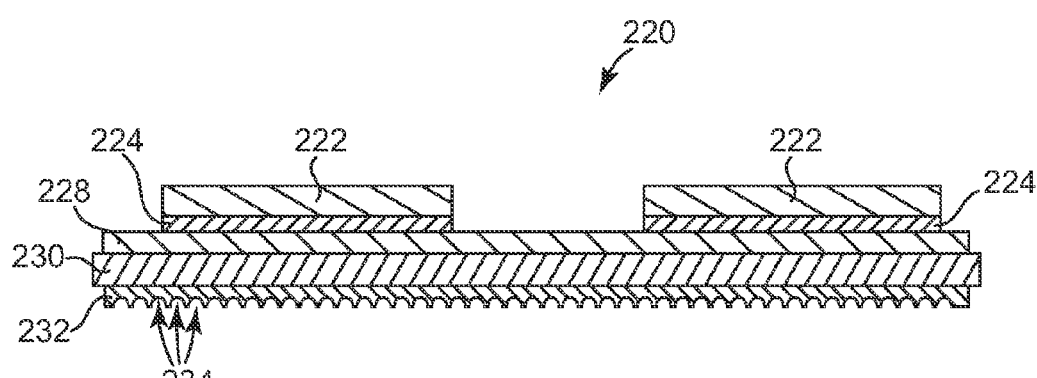
FIG. 4 illustrates a cross-sectional view of one embodiment of a portion of a module including a metallized substrate including roughness enhancing features.

FIG. 4 illustrates a cross-sectional view of one embodiment of a portion 220 of a module including a metallized substrate 230 including roughness enhancing features 234. Portion 220 of the module includes semiconductor chips 222, solder joints 224, and metallized ceramic substrate 230 including metal surfaces or layers 228 and 232. Semiconductor chips 222 are joined to metal layer 228 of metallized substrate 230 by solder joints 224.

Metal layer 232 includes roughness enhancing features 234, such as trenches, dimples, or other suitable features. In one embodiment, each roughness enhancing feature 234 has a depth greater than 20 μm, such as greater than 50 μm or greater than 100 μm. The lateral spacing between roughness enhancing features 234 is equal to the diameter of each roughness enhancing feature 234 or another suitable value. The diameter of each roughness enhancing feature 234 is up to approximately 1 mm, such as 20 μm, 50 μm, 100 μm, or another suitable value.

Roughness enhancing features 234 are etched into metal layer 232 or formed using another suitable method. Roughness enhancing features 234 provide increased roughness to the solder joint when metal layer 232 is soldered to a base plate. In one embodiment, metal layer 232 including roughness enhancing features 234 provides metal layer 112 previously described and illustrated with reference to FIG. 1 or metal layers 128 previously described and illustrated with reference to FIG. 2. In one embodiment, roughness enhancing features 234 are used in combination with an inter-metallic zone 206 as previously described and illustrated with reference to FIG. 3.

Figure 5A:
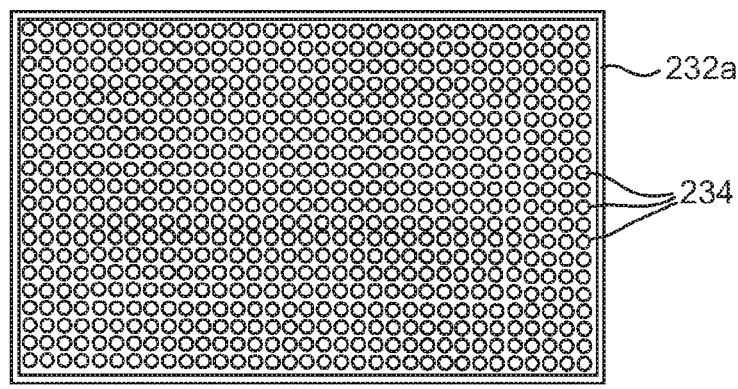
FIG. 5A illustrates a bottom view of one embodiment of a metallized substrate including a metal layer having roughness enhancing features.

FIG. 5A illustrates a bottom view of one embodiment of a metallized substrate including a metal layer 232a having roughness enhancing features 234. In this embodiment, roughness enhancing features 234 cover the entire surface of metal layer 232a. While roughness enhancing features 234 illustrated in FIG. 5A include dimples, in other embodiments any suitable roughness enhancing features that increase the roughness of the surface of metal layer 232a are used.

Figure 5B:
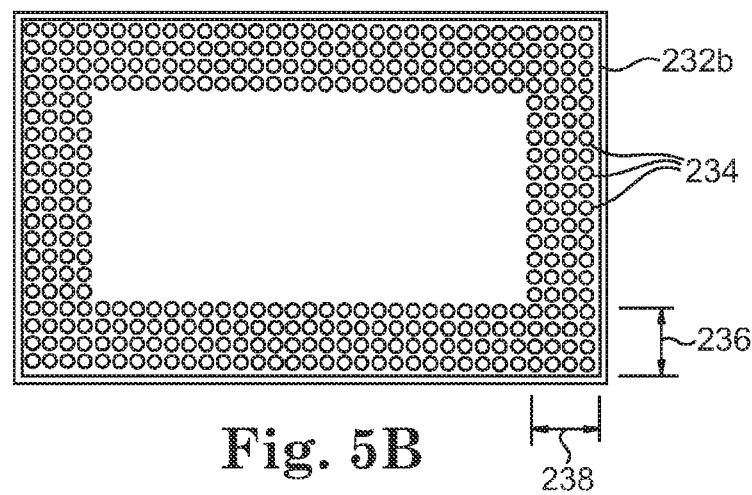
FIG. 5B illustrates a bottom view of another embodiment of a metallized substrate including a metal layer having roughness enhancing features.

FIG. 5B illustrates a bottom view of another embodiment of a metallized substrate including a metal layer 232b having roughness enhancing features 234. In this embodiment, roughness enhancing features 234 cover the outer edges of the surface of metal layer 232b. Roughness enhancing features 234 extend from the outer edge of the surface of metal layer 232b by a first distance indicated by 236 on first sides of metal layer 232b and by a second distance indicated by 238 on second sides of metal layer 232b, where the second sides are perpendicular to the first sides. In one embodiment, distance 236 equals distance 238. In one embodiment, distances 236 and 238 are greater than or equal to 10 mm. While roughness enhancing features 234 illustrated in FIG. 5B include dimples, in other embodiments any suitable roughness enhancing features that increase the roughness of the surface of metal layer 232b are used.

Figure 5C:
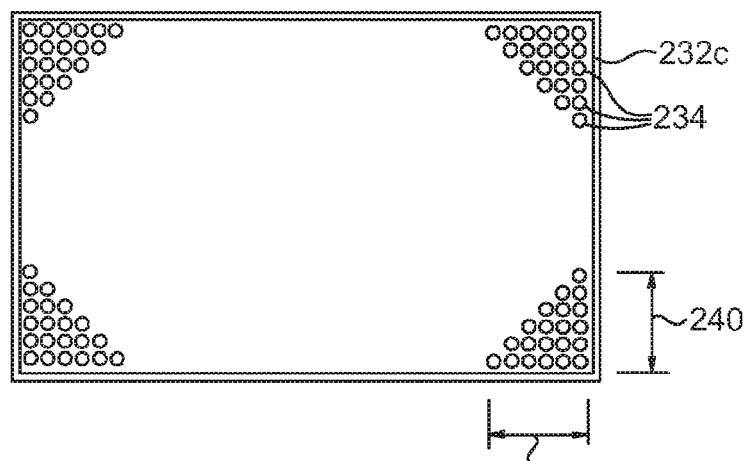
FIG. 5C illustrates a bottom view of another embodiment of a metallized substrate including a metal layer having roughness enhancing features.

FIG. 5C illustrates a bottom view of another embodiment of a metallized substrate including a metal layer 232c having roughness enhancing features 234. In this embodiment, roughness enhancing features 234 form a triangle at each corner of metal layer 232c. Roughness enhancing features 234 extend from each corner of the surface of metal layer 232c by a first distance indicated by 240 on first sides of metal layer 232c and by a second distance indicated by 242 on second sides of metal layer 232c, where the second sides are perpendicular to the first sides. In one embodiment, distance 240 equals distance 242. In one embodiment, distances 240 and 242 are greater than or equal to 10 mm. While roughness enhancing features 234 illustrated in FIG. 5C include dimples, in other embodiments any suitable roughness enhancing features that increase the roughness of the surface of metal layer 232c are used.

Figure 6:
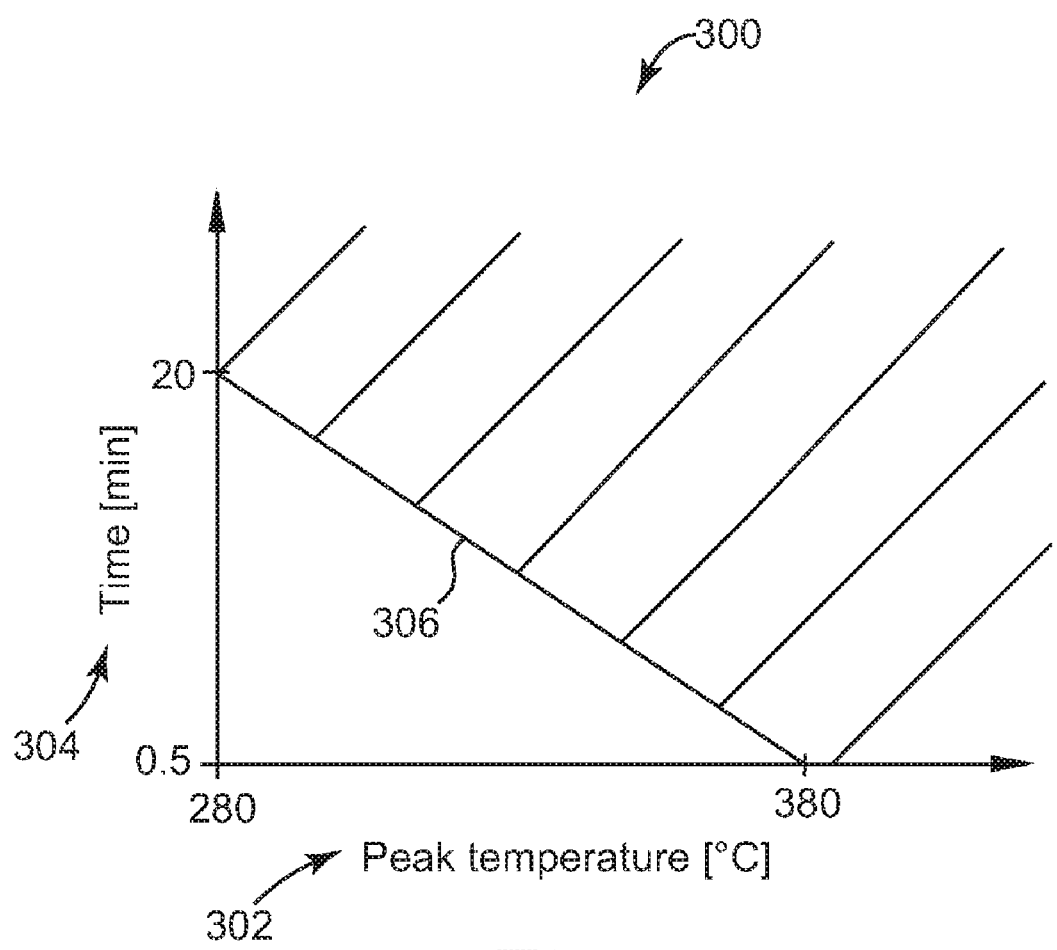
FIG. 6 is a graph illustrating one embodiment of soldering temperatures versus time for forming an inter-metallic zone.

FIG. 6 is a graph 300 illustrating one embodiment of soldering temperatures versus time for forming an inter-metallic zone, such as inter-metallic zone 206 previously described and illustrated with reference to FIG. 3. Graph 300 includes peak soldering temperature in degrees Celsius on x-axis 302 using a log scale and time in minutes on y-axis 304. In one embodiment, to form an inter-metallic zone 206 as previously described and illustrated with reference to FIG. 3, a soldering temperature and time within the range as indicated at 306 is used. As indicated at 306, as the peak soldering temperature increases, the soldering time decreases. As the peak soldering temperature decreases, the soldering time increases. For example, in one embodiment, the soldering temperature is approximately 350° C. for 3 minutes to provide an inter-metallic zone 206 including spikes 210 up to 100 µm and a roughness ($R_z$) of at least 20 µm.

Embodiments provide solder joints including soft solder and an inter-metallic zone having spikes of as least 10 µm, such as up to 100 µm, and a roughness of at least 20 µm. In one embodiment, a metal layer to be soldered includes roughness enhancing features, such as trenches, dimples, or other suitable features to increase the roughness of the solder joint and to enhance the growth of the inter-metallic zone. The roughness of the solder joint reduces the stress on the solder joint due to thermal cycling, thereby preventing a failure of the solder joint.

While the illustrated embodiments substantially focused on power electronic modules, the embodiments are applicable to any modules where a solder joint capable of withstanding thermal cycling is desired.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A module comprising:
   a metallized substrate including a metal layer comprising one of Cu and Ag;
   a base plate; and
   a joint joining the metal layer to the base plate, the joint comprising solder contacting the base plate and an inter-metallic zone contacting the metal layer and the solder, the inter-metallic zone having spikes up to 100 µm and a roughness ($R_z$) of at least 20 µm,
   wherein the solder is separate from the inter-metallic zone such that the spikes extend into the solder.

2. The module of claim 1, wherein the base plate comprises one of Cu, Ni, and Ag.

3. The module of claim 1, wherein the solder comprises at least one of Sn—Cu, Sn—Ag, Sn—Ag—Cu, Sn—Sb, Sn—Ag—Sb, Cu particles, and Ag particles.

4. The module of claim 1, wherein the inter-metallic zone comprises Sn—Cu.

5. The module of claim 1, wherein the metal layer comprises roughness enhancing features.

6. The module of claim 1, wherein the metal layer comprises at least one of an activator, an accelerator, and a catalyst for the formation of the inter-metallic zone during soldering.

7. A module comprising:
   a metallized substrate comprising a metal layer comprising one of Cu and Ag;
   a base plate comprising one of Cu and Ag; and
   means for joining the metal layer to the base plate, the means comprising solder and an inter-metallic zone separate from the solder and including an interface between the solder and the inter-metallic zone having a roughness ($R_z$) of at least 20 µm.

8. The module of claim 7, wherein the metal layer comprises roughness enhancing features.

9. The module of claim 7, wherein the inter-metallic zone has spikes of at least 10 µm.

10. The module of claim 7, wherein the means comprises islands of inter-metallic alloy embedded in the solder.

11. The module of claim 7, wherein the metallized substrate comprises a plated metal layer over the metal layer.

12. The module of claim 7, wherein the module comprises a power electronic module.

13. A module comprising:
    a metallized substrate comprising a metal layer comprising Cu and an activator X;
    a base plate; and
    a joint joining the metal layer to the base plate, the joint comprising solder contacting the base plate and an Sn—Cu—X alloy inter-metallic zone contacting the metal layer and the solder, the inter-metallic zone having spikes up to 100 µm and a roughness ($R_z$) of at least 20 µm,
    wherein the solder is separate from the inter-metallic zone such that the spikes extend into the solder.

14. The module of claim 13, wherein the base plate comprises Cu.

15. The module of claim 13, wherein the solder comprises Sn—Cu.

16. The module of claim 13, wherein the metal layer comprises roughness enhancing features contacting the joint.

17. The module of claim 13, wherein the joint comprises islands of inter-metallic alloy embedded in the solder.

18. The module of claim 13, wherein the metallized substrate comprises a plated metal layer over the metal layer.

19. The module of claim 13, wherein the module comprises a power electronic module.

* * * * *